(12) United States Patent
Malatkar et al.

(10) Patent No.: US 9,548,284 B2
(45) Date of Patent: Jan. 17, 2017

(54) REDUCED EXPANSION THERMAL COMPRESSION BONDING PROCESS BOND HEAD

(71) Applicant: Intel Corporation, Santa Clara, CA (US)

(72) Inventors: Pramod Malatkar, Chandler, AZ (US); Hemanth Dhavaleswarapu, Chandler, AZ (US); James Neeb, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 434 days.

(21) Appl. No.: 14/132,812

(22) Filed: Dec. 18, 2013

(65) Prior Publication Data

US 2015/0171047 A1 Jun. 18, 2015

(51) Int. Cl.
*H01L 23/00* (2006.01)
*H01L 21/603* (2006.01)
*B29L 31/34* (2006.01)

(52) U.S. Cl.
CPC ............ *H01L 24/75* (2013.01); *B29L 2031/34* (2013.01); *B29L 2031/3425* (2013.01); *H01L 2021/603* (2013.01); *H01L 2224/75102* (2013.01); *H01L 2224/75252* (2013.01); *H01L 2224/75266* (2013.01); *H01L 2224/75301* (2013.01); *H01L 2224/75501* (2013.01); *H01L 2224/75502* (2013.01); *H01L 2224/81203* (2013.01); *H01L 2224/81801* (2013.01); *H01L 2924/0104* (2013.01); *H01L 2924/01008* (2013.01); *H01L 2924/01014* (2013.01); *H01L 2924/01022* (2013.01); *H01L 2924/01074* (2013.01); *H01L 2924/0474* (2013.01); *H01L 2924/0489* (2013.01); *H01L 2924/04894* (2013.01); *H01L 2924/05032* (2013.01); *H01L 2924/0549* (2013.01); *Y10T 29/49826* (2015.01)

(58) Field of Classification Search
CPC ............ H01L 2224/75301; H01L 2224/81203; H01L 2224/81801; H01L 24/75; H01L 2224/75252; H01L 2224/75266; H01L 2224/75302; H01L 2224/7531; H01L 2224/75502; H01L 2224/75; Y10T 29/49826; Y10T 403/21
USPC ........ 156/583.1, 498; 165/81, 168, 169, 170
See application file for complete search history.

(56) References Cited

U.S. PATENT DOCUMENTS 2,071,322 A * 2/1937 Balfe ...................... F16J 15/122
　　　　　　　　　　　　　　　　　　　277/608
5,305,021 A * 4/1994 Ota ....................... B41J 2/33535
　　　　　　　　　　　　　　　　　　　347/201

(Continued)

*Primary Examiner* — Philip Tucker
*Assistant Examiner* — Jimmy R Smith, Jr.
(74) *Attorney, Agent, or Firm* — Schwegman Lundberg & Woessner, P.A.

(57) ABSTRACT

Embodiments of a thermal compression bonding process bond head and a method for producing a thermal compression bonding process bond head are disclosed. In some embodiments, the bond head includes a thermal compression bonding process heater and a cooling block coupled to the heater through an annular structure. The annular structure surrounds a lower portion of the cooling block and couples the cooling block to the heater such that there is no direct mechanical contact between the cooling block and the heater.

8 Claims, 4 Drawing Sheets

(56) References Cited

U.S. PATENT DOCUMENTS

| | | | |
|---|---|---|---|
| 6,414,271 B2 * | 7/2002 | Yokoyama | B23K 3/0471 219/243 |
| 6,733,015 B2 * | 5/2004 | Forry | F16J 15/022 277/590 |
| 7,518,233 B1 * | 4/2009 | Takahashi | H01L 23/4006 257/675 |
| 2006/0204776 A1 * | 9/2006 | Chen | B81B 3/0072 428/616 |

\* cited by examiner

REDUCED EXPANSION THERMAL COMPRESSION BONDING PROCESS BOND HEAD

TECHNICAL FIELD

Embodiments described herein generally relate to thermal compression bonding. Some embodiments relate to a reduced thermal expansion thermal compression bonding process bond head.

BACKGROUND

Integrated circuit dies may be attached to substrates, circuit boards, or other dies using a process commonly referred to in the art as thermal compression bonding. Solder balls may be attached to various points of the die that are desired to be anchored to the substrate. The die may then be heated to melt the solder balls. The die and substrate may then be compressed such that, when the solder balls cool, the die may be attached to the substrate. A thermal compression bonding (TCB) process bond head may include a heater used during a fabrication process to heat the die, substrate, and solder balls in order to perform the bonding.

FIG. 1 illustrates a typical stack of a memory die 100, a logic die 101, and a substrate 102 that may be bonded using a TCB process. TCB may be used for attaching the memory die 100 to the logic die 101 with through silicon vias at a joint that may commonly be referred to as a logic-to-memory interconnect (LMI) joint 110. TCB may also be used in a first level interconnect (FLI) joint 111 between the logic die 101 and the substrate 102. The LMI joint 110 height may be very small compared to the FLI joint 111 height. For example, the LMI joint 110 height might be around 5 µm while the FLI joint 111 height might be around 50 µm. Thus, the positioning of the memory and logic dies 100, 101 during the TCB process should be very accurate to avoid bonding and joint problems.

One problem that may occur with the present TCB process is that, as the heater temperature increases, the TCB head may expand. Downward expansion of the head may cause the LMI joint height to become even smaller. This may result in solder ball bridging, resulting in shorting together of interconnects, and/or cracks in the dies 100, 101.

There are general needs for better control of joint heights during a thermal compression bonding process.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A TCB process may use very tight tolerances (e.g., 5 µm) in joining integrated circuit dies to each other and to substrates. For example, attaching a memory die to a logic die with through solder vias may have a joint on the order of 5 µm. Thus, expansion of a TCB bond head may cause alignment issues resulting in a poor joint.

Figure 1:
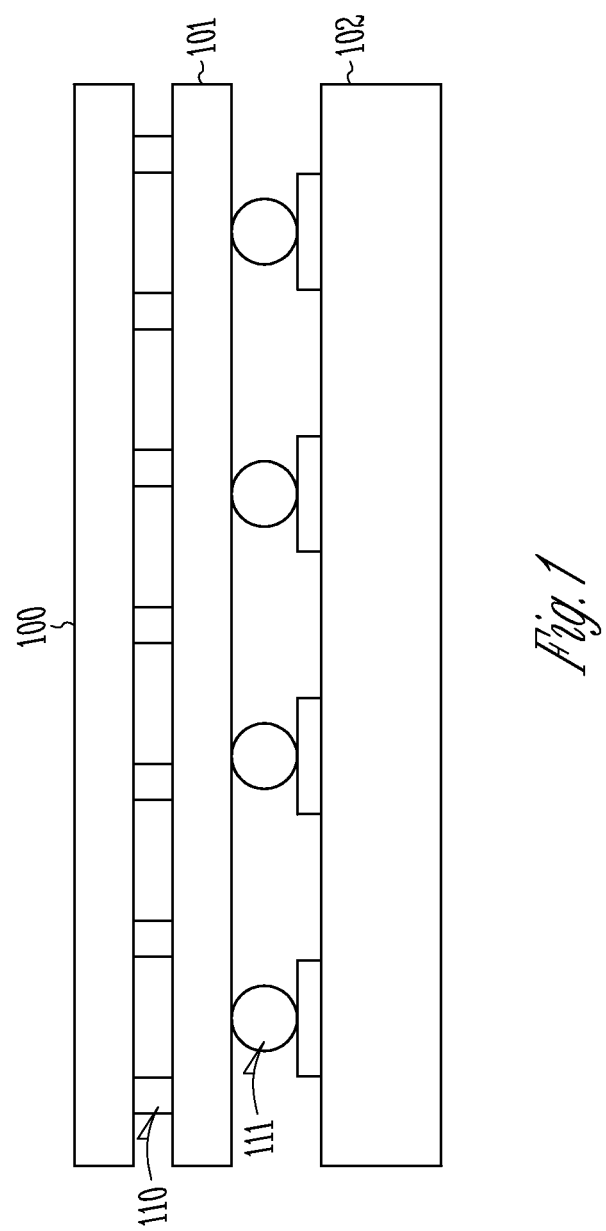
FIG. 1 illustrates a block diagram of a typical stack of a memory die, a logic die, and a substrate.
Figure 2:
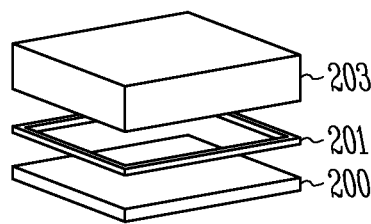
FIG. 2 illustrates an expanded view of a typical prior art thermal compression bonding (TCB) process bond head.

FIG. 2 illustrates an expanded view of a typical prior art TCB bond head, hereafter referred to as a bond head. The bond head may include a heater 200 that may be used to generate the desired temperatures to melt the solder used to attach integrated circuit dies to each other and to a substrate. A cooling block 203 may be connected to the heater 200 through a sealant 201.

Figure 3:
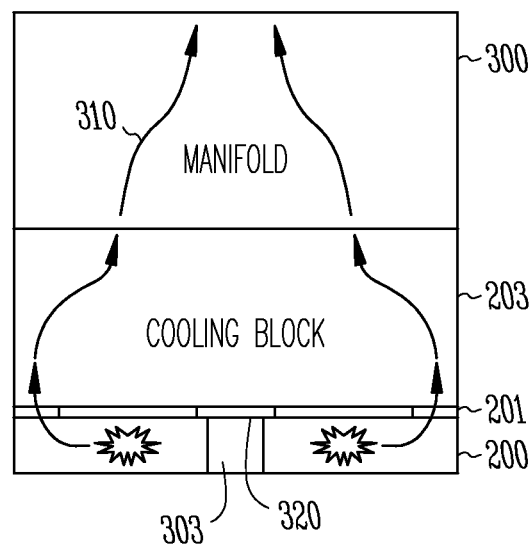
FIG. 3 illustrates a cross-sectional view of the typical prior art TCB bond head in accordance with the embodiment of FIG. 2.

FIG. 3 illustrates a cross-sectional view of the typical prior art bond head in accordance with the embodiment of FIG. 2. The heater 200 is shown connected to the cooling block 203 with the sealant 201. This forms a direct interface between the cooling block 203 and the heater 200.

A manifold 300 may be connected to the cooling block 203 to aid in the conduction of heat from the heater 200. For example, a heat transfer path 310 is shown wherein the heat may be conducted away from the heater 200 through the sealant 201 and the cooling block 203 to be dissipated by the manifold 300 with air that is pumped into passages of the manifold 300 during a cooling cycle. Another portion 320 of the cooling block 203 around a heater vacuum port 303 may also be in direct contact with the heater 200. The heater vacuum port may be used to channel a vacuum force to attach the heater 200 to a die or substrate.

The direct interface of the cooling block 203 to the heater 200 may cause an expansion and contraction of the cooling block 203 during heating and cooling cycles, respectively. This expansion and contraction may cause an undesirable movement of the bond head, thus causing alignment problems during the TCB process. For example, downward movement of one or more elements of the bond head may cause a first die being bonded to a second die to be closer than anticipated and, thus, cause the melted solder to expand to other balls and pads, resulting in short circuits.

In order to reduce the expansion and contraction of the cooling block in the bond head, the cooling block may not be directly connected to the heater. In place of the direct interface, an interfacial thermal expansion coefficient compensating structure, such as a subsequently described annular structure, may act as an interface between the cooling block and the heater.

In an embodiment, the annular structure may include an annular ring of material having a negative thermal expansion structure in order to compensate for the positive thermal expansion of the bond head. Such an embodiment is illustrated in FIGS. 4 and 5.

Figure 6:
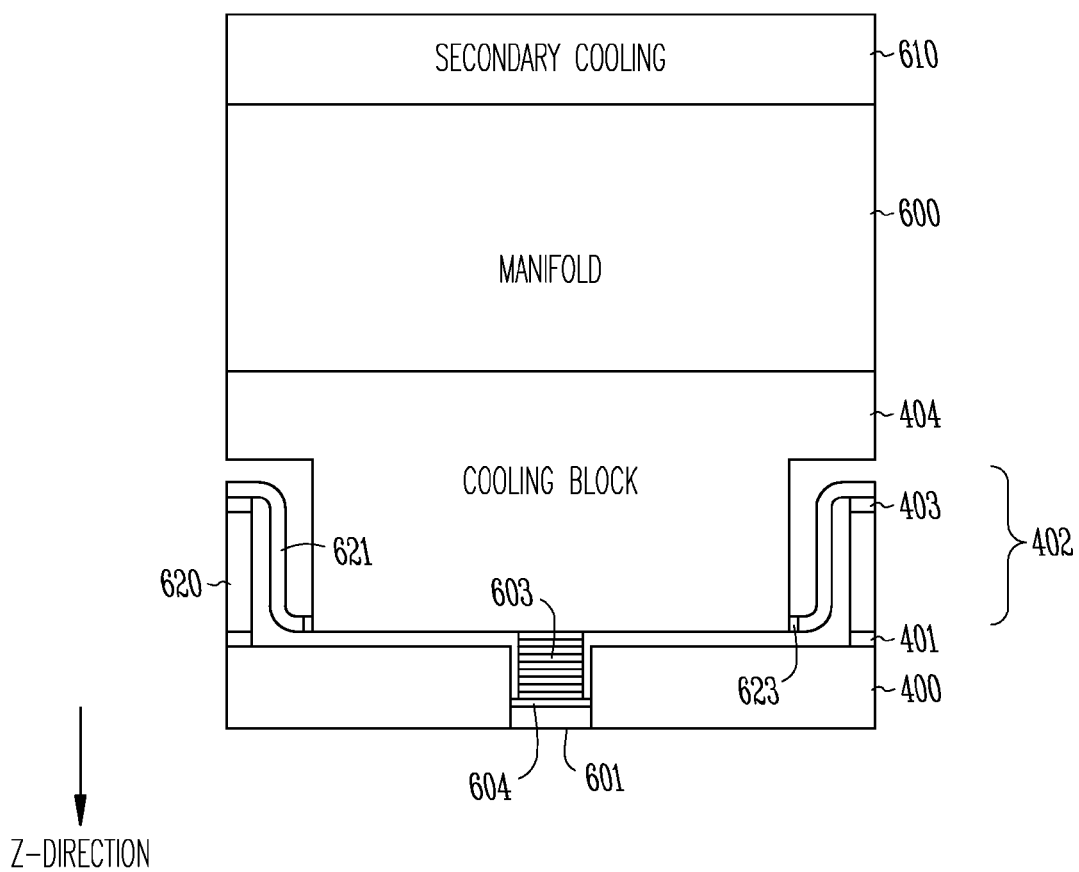
FIG. 6 illustrates a cross-sectional view of another embodiment of the TCB bond head in accordance with the embodiment of FIG. 4.

In another embodiment, the annular structure may include a multiple annular ring structure to compensate for the positive thermal expansion of the bond head. Such an embodiment is illustrated in FIGS. 4 and 6.

Figure 4:
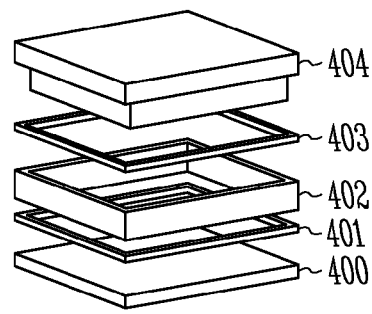
FIG. 4 illustrates an expanded view of an embodiment of a TCB bond head having reduced thermal expansion properties.
Figure 5:
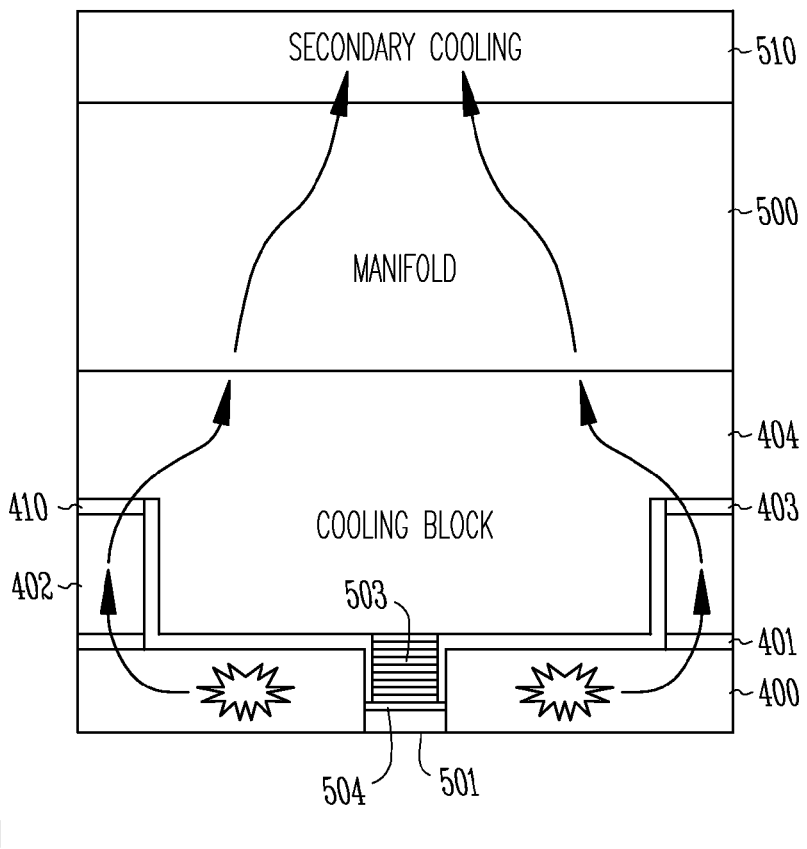
FIG. 5 illustrates a cross-sectional view of an embodiment of the TCB bond head in accordance with the embodiment of FIG. 4.

FIG. 4 illustrates an expanded view of an embodiment of the bond head in which there is no direct interface between the heater 400 and the cooling block 404. Such a configuration may reduce the amount of heat transferred to the cooling block 404 and, thus, the amount of expansion and contraction of the bond head during the heating and cooling of a TCB process.

The bond head may comprise a heater 400 configured to increase the temperature of an integrated circuit die or substrate such that any solder coupled to the die or substrate may melt. The heater 400 may comprise heating elements that may be able to quickly increase the temperature of the heater 400. For example, the heater 400 may be able to increase its temperature from 100° C. to 300° C. in a matter of one or two seconds.

An annular structure 402 may be coupled to the heater 400 with a first sealant 401. The first sealant 401 may be used to not only attach the annular structure 402 to the heater 400 but also conduct heat from the heater 400 to other elements of the bond head. In an embodiment, the first sealant 401 may be a high temperature ceramic sealant.

A cooling block 404 may be coupled to the annular structure 402 with a second sealant 403. As in the first sealant 401, the second sealant 403 may be used to both attach the cooling block 404 to the annular structure 402 as well as conduct heat from the annular structure 402 to other elements of the bond head. In an embodiment, the second sealant 403 may have the same composition as the first sealant. Another embodiment may use a different composition for the second sealant 403.

The cooling block 404 may be coupled to a manifold 500 (shown in FIG. 5) for further heat dissipation in order to facilitate cooling of the heater 400 after the solder has been melted. Since the bond head may typically be used in an assembly line process for bonding dies, not only may the heater rapidly increase its temperature, but, in the interest of efficiency, the heater may rapidly cool as well. The rapid cooling may be aided by the cooling block 404 that may rapidly conduct the heat from the heater 400 to the manifold 500.

The cooling block 404 may be made of a material that aids in the rapid conduction and dissipation of heat from the heater 400. In an embodiment, the cooling block 404 may be made of aluminum nitride.

The cooling block 404 may comprise a recess around its lower periphery in order to accept the annular structure 402. Other embodiments might use a different cooling block 404 structure in order to accept the annular structure 402.

FIG. 5 illustrates a cross-sectional view of an embodiment of the bond head in accordance with the embodiment of FIG. 4. The illustrated embodiment uses the annular structure 402 comprising a negative thermal expansion material in order to compensate for the positive thermal expansion of the rest of the bond head.

FIG. 5 illustrates the heater 400 coupled to the cooling block 404 through the annular structure 402 and the first and second sealants 401, 403. The cross-sectional view shows that the annular structure 402 fits within the recess formed around the periphery of the cooling block 404.

The cooling block 404 may be coupled to the manifold 500. The manifold 500 may be configured to aid in the transfer of the heat away from the heater 400. The manifold 500 may be coupled to a secondary cooling element 510 that may absorb and/or dissipate the heat provided from the manifold 500. The secondary cooling element 510 may maintain the top surface of the manifold 500 at a substantially fixed temperature thus stopping any heat from propagating further up the bond head.

A bellows 503 may couple a vacuum port 501 in the heater 400 through the cooling block 404 and eventually to a vacuum system (not shown) that may produce a vacuum force. The bellows 503 may also keep the cooling block 404 and heater 400 mechanically decoupled to further reduce heat conduction. The vacuum port 501 may be responsible for channeling the vacuum force to hold the die (not shown) to the heater 400 during the TCB process. The present embodiments are not limited to a bellows 503 between the vacuum port 501 and the heater 400 through the cooling block 404. Any connection that allows relative movement between the vacuum port 501 and the vacuum system, while still channeling the vacuum force, may be used.

A gasket 504 coupled around the bellows 503 may be used to seal the vacuum port 501 against possible vacuum leaks between the bellows 503 and the heater 400. In an embodiment, the gasket 504 may be silicone or stainless steel.

The annular structure 402, in the embodiment of FIG. 5, comprises a negative thermal expansion material. A material having a negative thermal expansion coefficient may contract when heated. Examples of such materials may include zirconium tungstate ($ZrW_2O_8$), Siliceous Faujasite, and glasses in the titania-silica family. These materials are for purposes of illustration only as the annular structure 402 of FIG. 5 may comprise any material having a negative thermal expansion coefficient.

The annular structure 402 experiences substantially the same temperature change as other parts of the bond head. Thus, when the heater 400, cooling block 404, and other parts of the bond head expand due to the temperature increase, the annular structure 402 may contract due to the temperature increase. This may have the effect of compensating for the thermal expansion.

The height of the annular structure 402 may be chosen in order to substantially match the contraction amount of the annular structure 402 with the expansion amount of the other parts of the bond head. As an example of determining the annular structure 402 height, assuming a 1-D conduction along the z-direction (see FIG. 5) in the annular structure 402, the temperature induced change in height may be expressed as $\Delta H = H \alpha \Delta T$, where H is the height of the annular structure 402, $\alpha$ is the thermal expansion coefficient, $\Delta H$ is the change in height, and $\Delta T$ is the temperature change. Assuming an expansion of the bond head on the order of 15 mm, then, assuming a $\Delta H = -15$ mm (assigned to be negative since an equal amount of contraction is desired), $\Delta T = 200°$ C., $\alpha = -7.2$ ppm (for Zirconium Tungstate), H may be determined to be 10 mm. In other words, an expansion of a 10 mm negative thermal expansion annular structure may substantially equal an expansion of the bond head (including the heater). Thus, an annular structure having a height of 10 mm may negate the bond head expansion due to temperature changes.

In the prior art design of the bond head, as seen in FIGS. 2 and 3, the cooling block 203 may be in direct contact with the heater 200. Thus, in the prior art, the entire length of the cooling block 203 may act as a heat sink.

In the embodiments disclosed in FIGS. 4-6, the annular structure 402 may be the only contact of the cooling block 404 to the heater 400. Thus, the use of the annular structure 402 may reduce the net heat being conducted to the rest of the bond head, thus reducing the thermal expansion of the bond head and further reducing the above determined estimated height of the annular structure 402.

FIG. 6 illustrates a cross-sectional view of another embodiment of the bond head in accordance with the embodiment of FIG. 4. This embodiment uses an annular structure 402 made up of multiple materials.

As in the embodiment of FIG. 5, the embodiment of FIG. 6 includes the heater 400 coupled to the cooling block 404 through the annular structure 402. The manifold 600 may be coupled to the cooling block 404 and the secondary cooling element 610 may be coupled to the top of the manifold 600. A bellows 603 may couple a vacuum port 601 in the heater 400 to the cooling block 404 and eventually to a vacuum system (not shown) that may produce a vacuum force to hold the die to the heater 400. Except for the annular structure 402, the functions and structure of the elements of the bond head are substantially similar to the embodiment described above with reference to FIG. 5.

The annular structure 402, however, may include multiple annular rings 620, 621, each having different thermal properties. A first of the annular rings 620 may have a low coefficient of thermal expansion while a second of the annular rings 621 may have a high coefficient of thermal expansion. Thus, the coefficient of thermal expansion of the first annular ring 620 may be less than the coefficient of thermal expansion of the second annular ring 621. In an embodiment, both of the coefficients of thermal expansion are positive.

Referring to FIG. 6, the first annular ring 620 may be coupled to the heater through the first sealant 401. The first annular ring 620 may be coupled substantially vertically within the recess of the cooling block. The second annular ring 621 may be coupled to the top of the first annular ring 620 with the second sealant 403. The second annular ring 621 may then curve down to be coupled to the bottom of the cooling block 404 with a third sealant 623 and within the recess. The different sealants 401, 403, 623 may have all the same composition or different compositions.

The first and second annular rings 620, 621 remove any direct mechanical contact between the cooling block 404 and the heater 400. Thus, the heat conduction from the heater 400 to the rest of the bond head may be reduced.

The first annular ring 620 may comprise a material having a low positive coefficient of thermal expansion. Examples of such materials may include ceramics, aluminum nitride, borosilicate glass, fused quartz, or tungsten.

The second annular ring 621 may comprise a material having a high positive coefficient of thermal expansion. Examples of such materials may include aluminum or copper.

The materials discussed above having the different coefficients of thermal expansion are for purposes of illustration only. Other embodiments may use other materials having substantially similar properties.

The difference in the z-direction expansion of the two annular rings 620, 621, with different coefficients of thermal expansion, may compensate for the overall thermal expansion of the bond head. The materials for each annular ring 620, 621 may be chosen such that their different individual expansions compensate for the bond head's thermal expansion. This may be illustrated by the equation: (expansion of second annular ring 621)−(expansion of first annular ring 620)=(expansion of the bond head (including the heater)).

EXAMPLES

The following examples pertain to further embodiments.

Example 1 is a thermal compression bonding process bond head comprising: a heater; a cooling block configured to conduct heat from the heater; and a thermal expansion coefficient compensating structure coupled to a portion of the cooling block and configured to couple the cooling block to the heater such that there is no direct interface between the cooling block and the heater.

In Example 2, the subject matter of Example 1 can optionally include wherein the cooling block comprises a recess surrounding a lower periphery wherein the thermal expansion coefficient compensating structure is coupled to the cooling block within the recess.

In Example 3, the subject matter of Examples 1-2 can optionally include wherein the thermal expansion coefficient compensating structure is coupled to the cooling block with a first sealant and to the heater with a second sealant.

In Example 4, the subject matter of Examples 1-3 can optionally include wherein the thermal expansion coefficient compensating structure comprises a material having a negative coefficient of thermal expansion.

In Example 5, the subject matter of Examples 1-4 can optionally include wherein the material having the negative coefficient of thermal expansion comprises one of: zirconium tungstate, Siliceous Faujasite, or glasses in a titania-silica family.

In Example 6, the subject matter of Examples 1-5 can optionally include wherein the thermal expansion coefficient compensating structure comprises a plurality of annular rings.

In Example 7, the subject matter of Examples 1-6 can optionally include wherein the plurality of annular rings comprise a first annular ring having a first coefficient of thermal expansion and a second annular ring having a second coefficient of thermal expansion wherein the first coefficient of thermal expansion is different than the second coefficient of thermal expansion.

In Example 8, the subject matter of Examples 1-7 can optionally include wherein the first coefficient of thermal expansion is less than the second coefficient of thermal expansion.

In Example 9, the subject matter of Examples 1-8 can optionally include wherein the plurality of annular rings comprise: a first annular ring coupled to the heater with a first sealant; and a second annular ring coupled to the first annular ring with a second sealant and to the cooling block with a third sealant.

In Example 10, the subject matter of Examples 1-9 can optionally include wherein the cooling block has a recess surrounding a lower periphery and the plurality of annular rings comprise: a first annular ring coupled to the heater substantially vertically within the recess; and a second annular ring coupled between a top of the first annular ring and a bottom of the cooling block within the recess.

Example 11 is a thermal compression bonding process bond head comprising: a heater configured to generate heat for melting solder; a cooling block configured to conduct the heat from the heater, the cooling block comprising a recess surrounding a lower periphery; a manifold coupled to the cooling block and configured to conduct heat from the cooling block; and an annular structure configured to couple the cooling block to the heater such that there is no direct mechanical contact between the cooling block and the heater, the annular structure coupled within the recess of the cooling block.

In Example 12, the subject matter of Example 11 can optionally include wherein the heater comprises a vacuum port and further comprising a connection allowing relative movement coupled to the cooling block and extending within the vacuum port.

In Example 13, the subject matter of Examples 11-12 can optionally include a gasket configured to seal the bellows within the vacuum port.

In Example 14, the subject matter of Examples 11-13 can optionally include a secondary cooling element coupled to the manifold, the secondary cooling element configured to maintain a top of the manifold at a substantially fixed temperature.

In Example 15, the subject matter of Examples 11-14 can optionally include wherein the annular structure comprises a plurality of annular rings wherein a first annular ring comprises one of aluminum or copper and a second annular ring comprises one of aluminum nitride, borosilicate glass, fused quartz, or tungsten.

Example 16 is a method for producing a thermal compression bonding process bond head, the method comprising: coupling an annular structure to a thermal compression bonding heater; and coupling a cooling block, having a recess surrounding its periphery, to the annular structure wherein the annular structure fits within the recess and is configured to couple the cooling block to the thermal compression bonding heater without any direct mechanical contact.

In Example 17, the subject matter of Example 16 can optionally include coupling a bellows through a vacuum port in the heater to the cooling block.

In Example 18, the subject matter of Examples 16-17 can optionally include coupling a gasket around the bellows and within the vacuum port such that the bellows is sealed within the vacuum port.

In Example 19, the subject matter of Examples 16-18 can optionally include wherein the annular structure comprises a plurality of rings and coupling the annular structure comprises: coupling a first annular ring substantially vertically to the heater; and coupling a second annular ring to a top of the first annular ring and to a bottom of the recess of the cooling block.

In Example 20, the subject matter of Examples 16-19 can optionally include wherein coupling the annular structure to the thermal compression bonding heater comprises coupling a material having a negative coefficient of thermal expansion to the thermal compression bonding heater.

What is claimed is:

1. A thermal compression bonding process bond head comprising:
   a heater;
   a cooling block configured to conduct heat from the heater; and
   a thermal expansion coefficient compensating structure coupled to a portion of the cooling block and configured to couple the cooling block to the heater such that there is no direct interface between the cooling block and the heater, wherein the thermal expansion coefficient compensating structure comprises a plurality of annular rings including a first annular ring having a first coefficient of thermal expansion and a second annular ring having a second coefficient of thermal expansion wherein the first coefficient of thermal expansion is different than the second coefficient of thermal expansion.

2. The thermal compression bonding process bond head of claim 1 wherein the cooling block comprises a recess surrounding a lower periphery wherein the thermal expansion coefficient compensating structure is coupled to the cooling block within the recess.

3. The thermal compression bonding process bond head of claim 1 wherein the thermal expansion coefficient compensating structure is coupled to the cooling block with a first sealant and to the heater with a second sealant.

4. The thermal compression bonding process bond head of claim 1 wherein the thermal expansion coefficient compensating structure comprises a material having a negative coefficient of thermal expansion.

5. The thermal compression bonding process bond head of claim 4 wherein the material having the negative coefficient of thermal expansion comprises one of: zirconium tungstate, Siliceous Faujasite, or glasses in a titania-silica family.

6. The thermal compression bonding process bond head of claim 1 wherein the plurality of annular rings comprise:
   the first annular ring coupled to the heater with a first sealant; and
   the second annular ring coupled to the first annular ring with a second sealant and to the cooling block with a third sealant.

7. The thermal compression bonding process bond head of claim 1 wherein the cooling block has a recess surrounding a lower periphery and the plurality of annular rings comprise:
   the first annular ring coupled to the heater substantially vertically within the recess; and
   the second annular ring coupled between a top of the first annular ring and a bottom of the cooling block within the recess.

8. A thermal compression bonding process bond head comprising:
   a heater;
   a cooling block configured to conduct heat from the heater; and
   a thermal expansion coefficient compensating structure coupled to a portion of the cooling block and configured to couple the cooling block to the heater such that there is no direct interface between the cooling block and the heater, wherein the thermal expansion coefficient compensating structure comprises a plurality of annular rings including a first annular ring coupled to the heater with a first sealant and having a first coefficient of thermal expansion and a second annular ring having a second coefficient of thermal expansion wherein the first coefficient of thermal expansion is less than the second coefficient of thermal expansion.

* * * * *